(12) United States Patent
Chen et al.

(10) Patent No.: US 12,219,708 B2
(45) Date of Patent: Feb. 4, 2025

(54) ELECTRONIC MODULE

(71) Applicant: CYNTEC CO., LTD., Hsinchu (TW)

(72) Inventors: Chien Ming Chen, Hsinchu County (TW); Da-Jung Chen, Taoyuan (TW)

(73) Assignee: CYNTEC CO., LTD., Hsinchu (TW)

( * ) Notice: Subject to any disclaimer, the term of this patent is extended or adjusted under 35 U.S.C. 154(b) by 227 days.

(21) Appl. No.: 17/883,648

(22) Filed: Aug. 9, 2022

(65) Prior Publication Data

US 2023/0049094 A1 Feb. 16, 2023

Related U.S. Application Data

(60) Provisional application No. 63/231,269, filed on Aug. 10, 2021.

(51) Int. Cl.
*H05K 1/14* (2006.01)
*H05K 1/18* (2006.01)

(52) U.S. Cl.
CPC ............. *H05K 1/147* (2013.01); *H05K 1/181* (2013.01); *H05K 1/189* (2013.01); *H05K 2201/058* (2013.01); *H05K 2201/1003* (2013.01)

(58) Field of Classification Search
CPC ........ H05K 1/147; H05K 1/181; H05K 1/189; H05K 2201/058; H05K 2201/1003
USPC ....................................................... 361/749
See application file for complete search history.

(56) References Cited

U.S. PATENT DOCUMENTS

| 2017/0201125 | A1* | 7/2017 | You | H01F 17/04 |
| 2020/0105461 | A1* | 4/2020 | Fu | H01F 27/325 |
| 2022/0183369 | A1* | 6/2022 | Blandino | H05K 1/0278 |

* cited by examiner

*Primary Examiner* — Binh B Tran
(74) *Attorney, Agent, or Firm* — Min-Lee Teng (57) ABSTRACT

An electronic module, comprising an inductor, a first circuit board, and a second circuit board, wherein the first circuit board is disposed on a lateral surface of the body of the inductor with at least one electronic device being disposed on the first circuit board, wherein the second circuit board is disposed under the body of the inductor and electrically connected to the inductor.

19 Claims, 12 Drawing Sheets

ELECTRONIC MODULE

CROSS-REFERENCES TO RELATED APPLICATIONS

The present application claims the benefit of U.S. Provisional Application Ser. No. 63/231,269 filed on Aug. 10, 2021, which is hereby incorporated by reference herein and made a part of the specification.

BACKGROUND OF THE INVENTION

I. Field of the Invention

The invention relates to an electronic module and, in particular, to an electronic module with an inductor.

II. Description of the Related Art

The number of electronic devices in an electronic module is gradually increasing while electronic modules are becoming smaller and smaller. Thus, how to reduce the size as well as the thickness of an electronic module becomes an important issue.

SUMMARY OF THE INVENTION

One objective of the present invention is to provide an electronic module having a circuit board comprising rigid and flexible substrates which can wrap around a body of an inductor so that electronic devices can be placed over lateral surfaces of the body of the inductor to effectively reduce the thickness of the electronic module.

In one embodiment of the present invention, an electronic module is provided, wherein the electronic module comprises: an inductor comprising a body and a conductive wire, wherein at least one portion of the conductive wire is disposed in the body, wherein the body comprises a first lateral surface and a bottom surface; a first circuit board, disposed over the first lateral surface, wherein at least one first electronic device is disposed over the first circuit board and electrically connected to the first circuit board; and a second circuit board, wherein the inductor is disposed over a top surface of the second circuit board and electrically connected to the second circuit board.

In one embodiment, the first circuit board is attached to the first lateral surface via an adhesive layer disposed over the first lateral surface.

In one embodiment, the first circuit board and the second circuit board are electrically connected via a third circuit board.

In one embodiment, the third circuit board is a flexible circuit board, wherein the first circuit board and the second circuit board are electrically connected via the third circuit board.

In one embodiment, each of the first circuit board, the second circuit board, and the third circuit board comprises a corresponding portion of a flexible substrate.

In one embodiment, the second circuit board comprises a rigid substrate and a flexible substrate, wherein at least one via is disposed in the flexible substrate.

In one embodiment, the first circuit board and the second circuit board are integrally formed as a contiguous circuit board that comprises at least one flexible substrate.

In one embodiment, each of the first circuit board and the second circuit board is a flexible circuit board.

In one embodiment, each of the first circuit board and the second circuit board comprises a PCB (printed circuit board).

In one embodiment, the first circuit board, the second circuit board, and the third circuit board are integrally formed as a contiguous circuit board that comprises a rigid substrate and a flexible substrate.

In one embodiment, a fourth circuit board is disposed over a second lateral surface of the body, wherein at least one second electronic device is disposed on the fourth circuit board, wherein the fourth circuit board and the second circuit board are electrically connected.

In one embodiment, the fourth circuit board and the second circuit board are electrically connected via a second flexible circuit board.

In one embodiment, the first circuit board, the second circuit board, the third circuit board, the first flexible circuit board, and the second flexible circuit board are integrally formed as a contiguous circuit board that comprises at least one rigid substrate and at least one flexible substrate.

In one embodiment, each of the first circuit board, the second circuit board, and the third circuit board is a flexible circuit board.

In one embodiment, the inductor is a choke.

In one embodiment, the body is a magnetic body, wherein a coil formed by the conductive wire is disposed in the magnetic body.

In one embodiment, a first terminal part of the conductive wire is extended across a bottom surface of the body for forming a first electrode of the inductor, wherein a first portion of the first terminal part of the conductive wire is located inside the body and a second portion of the first terminal part of the conductive wire is located under the body.

In one embodiment, a second terminal part of the conductive wire is extended across the bottom surface of the body for forming a second electrode of the inductor, wherein a first portion of the second terminal part of the conductive wire is located inside the body and a second portion of the second terminal part of the conductive wire is located under the body.

In one embodiment of the present invention, an electronic module is provided, wherein the electronic module comprises: an inductor, comprising a body comprising a first lateral surface and a bottom surface; a contiguous circuit board, comprising a first circuit board, a second circuit board, and a third circuit board, wherein the first circuit board is disposed over the first lateral surface with at least one first electronic device being disposed on the first circuit board, and the second circuit board is disposed under the body of the inductor and electrically connected to the inductor, wherein the third circuit board is a flexible circuit board that is electrically connecting the first circuit board and the second circuit board.

In one embodiment, the contiguous circuit board further comprises a fourth circuit board and a fifth circuit board, wherein the fourth circuit board is disposed over a second lateral surface of the body with at least one second electronic device being disposed on the fourth circuit board, wherein the fifth circuit board is a flexible circuit board that is electrically connecting the fourth circuit board and the second circuit board.

In one embodiment of the present invention, an electronic module is provided, wherein the electronic module comprises: a first electronic device comprising a body, wherein the body comprises a first lateral surface and a bottom surface; a first circuit board, disposed over the first lateral surface, wherein at least one second electronic device is disposed over the first circuit board and electrically connected to the first circuit board; and a second circuit board, wherein the first electronic device is disposed over a top surface of the second circuit board and electrically connected to the second circuit board.

BRIEF DESCRIPTION OF THE DRAWINGS

The present invention can be more fully understood by reading the subsequent description and examples with references made to the accompanying drawings, wherein.

DETAILED DESCRIPTION OF THE INVENTION

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features are formed between the first and second features, such that the first and second features are not in direct contact. Besides, the present disclosure may repeat reference numerals and/or letters in the various examples. This repetition is for simplicity and clarity and does not in itself dictate a relationship between the various embodiments and/or configurations discussed.

Figure 1A:
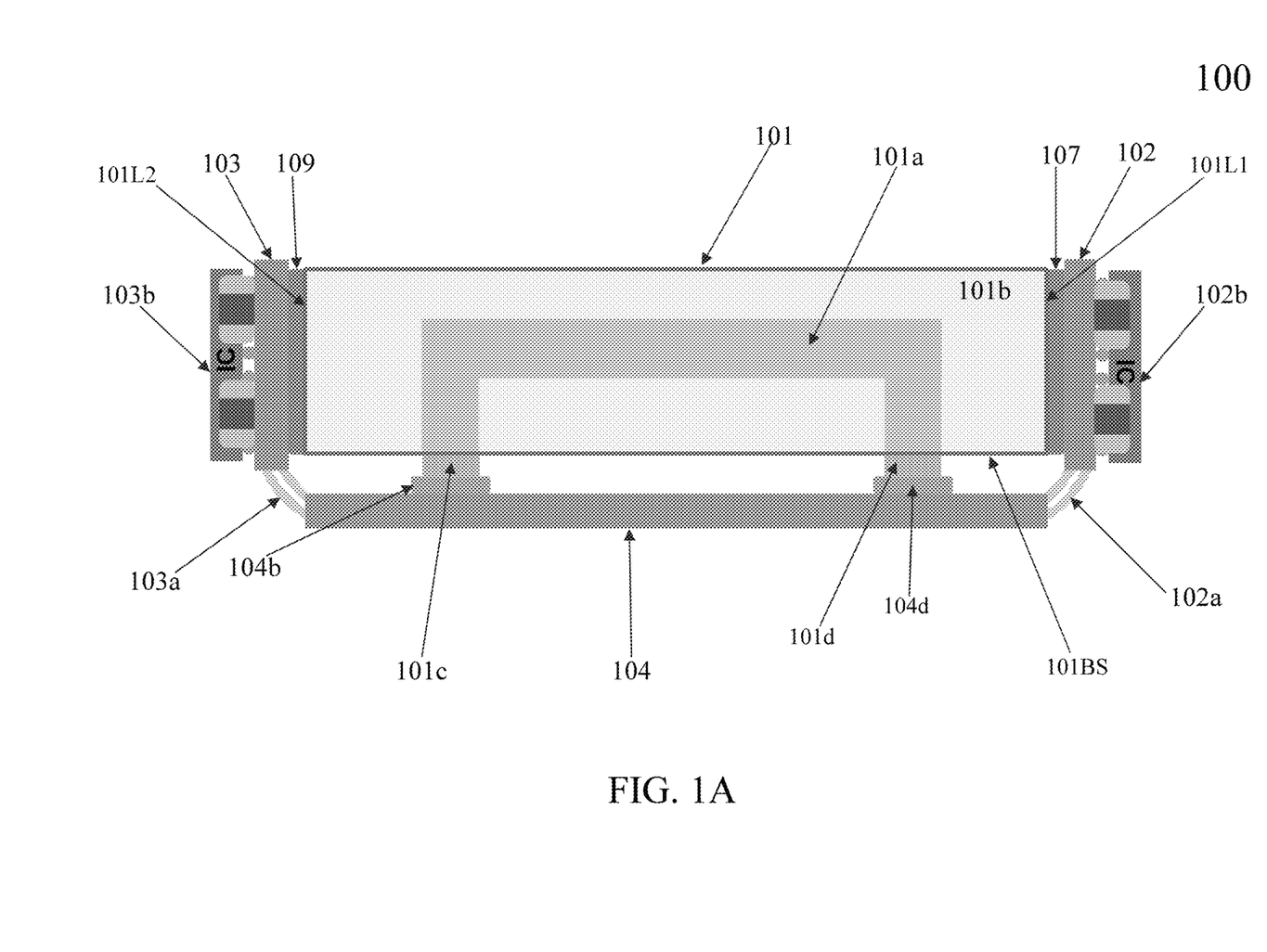
FIG. 1A is a cross-sectional side view of an electronic module according to one embodiment of the invention.
Figure 1B:
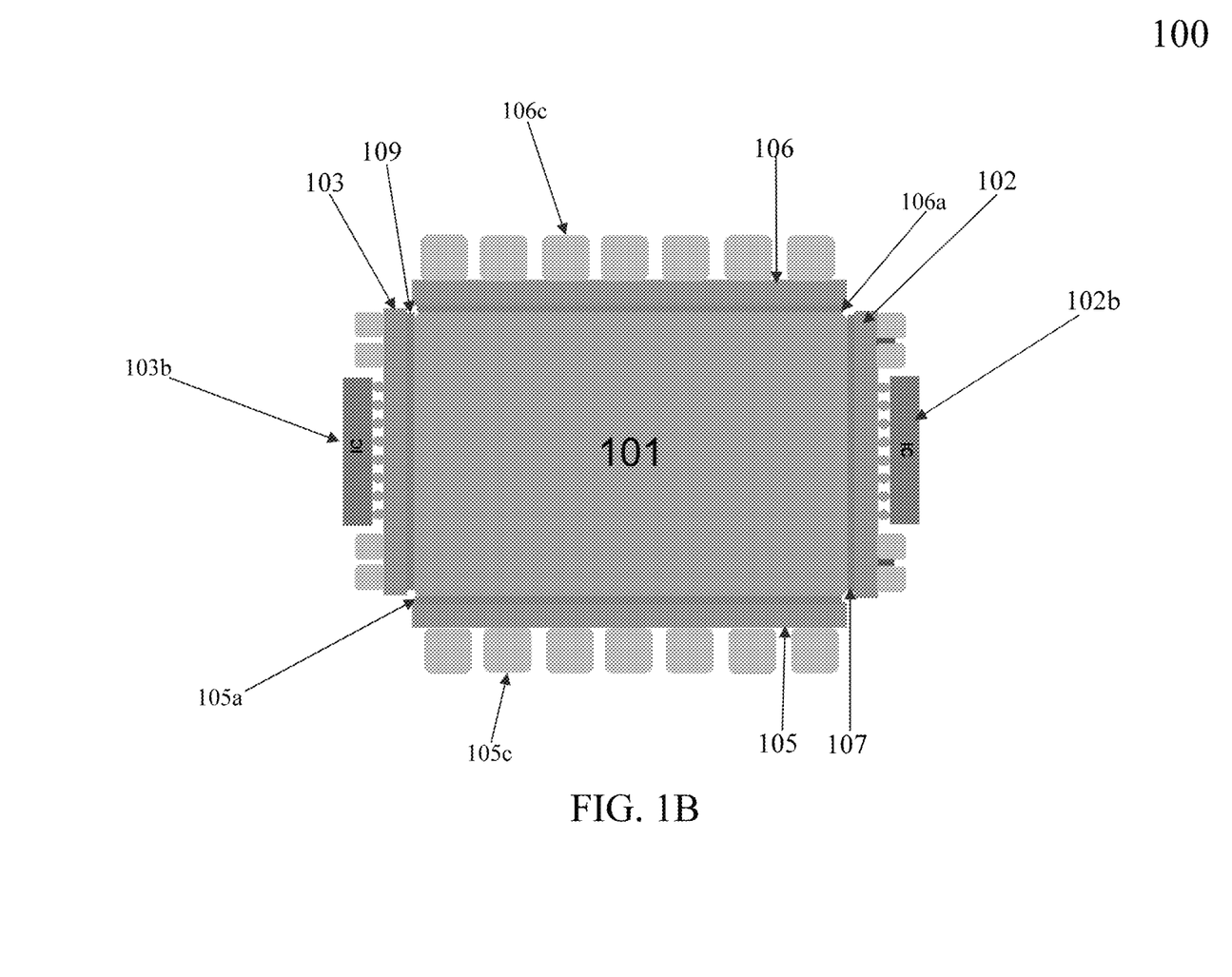
FIG. 1B is a top view of the electronic module according to one embodiment of the invention.
Figure 1C:
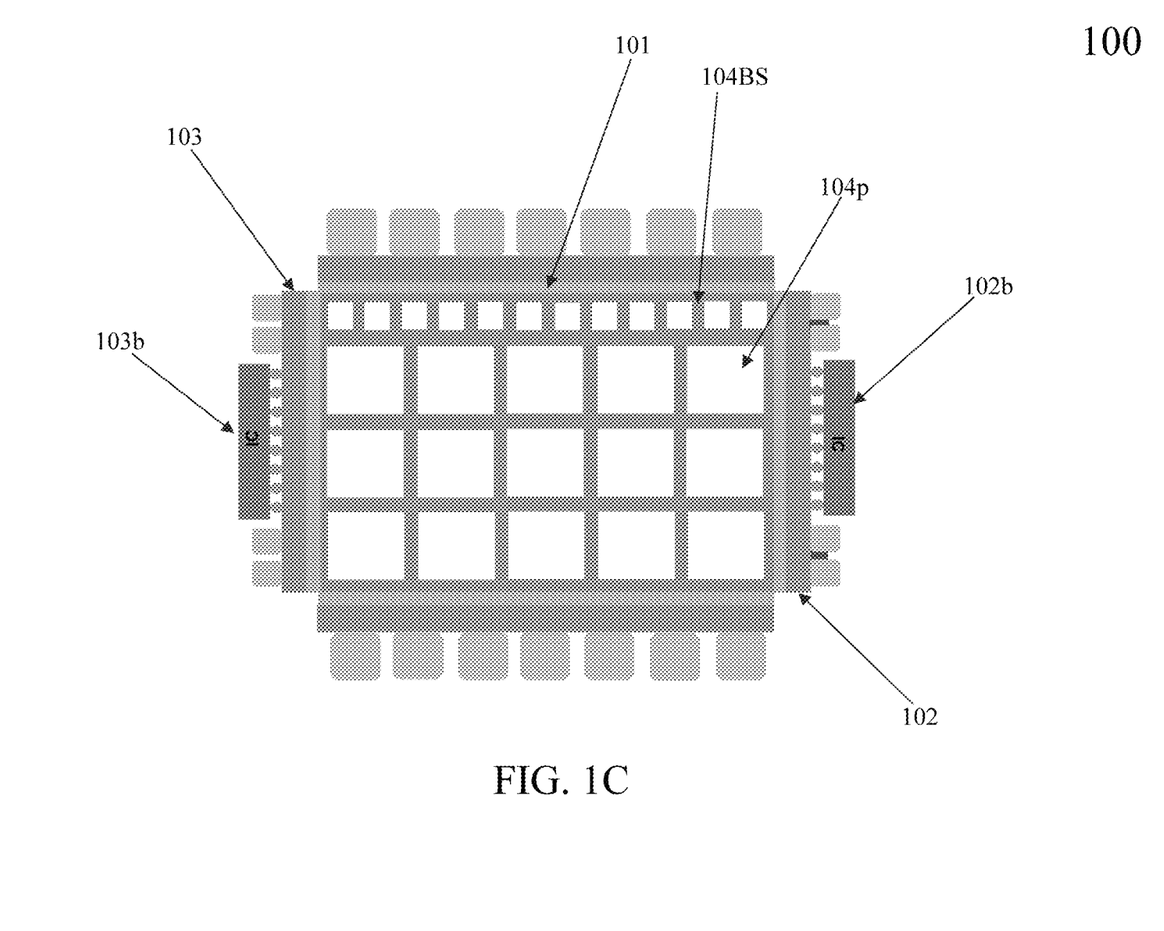
FIG. 1C is a bottom view of the electronic module according to one embodiment of the invention.

FIG. 1A is a cross-sectional side view of an electronic module according to one embodiment of the invention; FIG. 1B is a top view of the electronic module; and FIG. 1C is a bottom view of the electronic module.

As shown in FIG. 1A, the electronic module 100 comprises an electronic device such as an inductor 101, wherein the inductor 101 comprises a body 101b comprising a first lateral surface 101L1 and a bottom surface 101BS; a first circuit board 102, disposed over the first lateral surface 101L1, wherein at least one first electronic device 102b is disposed on the first circuit board 102 and electrically connected to the first circuit board 102; and a second circuit board 104, wherein the inductor 101 is disposed on the second circuit board 104 and electrically connected to the second circuit board 104, wherein the first circuit board 102 and the second circuit board 104 are electrically connected.

In the present invention, electronic devices include active devices, such as an integrated circuit (IC), a MOSFET, etc., and passive components, such as resistors, capacitors, and inductors.

In one embodiment, the first circuit board 102 is attached to the first lateral surface 101L1 via a first adhesive layer 107, as shown in FIG. 1A.

In one embodiment, the fourth circuit board 103 is attached to a second lateral surface 101L2 via a second adhesive layer 109, as shown in FIG. 1A.

In one embodiment, the first circuit board 102 and the second circuit board 104 are electrically connected via the third circuit board 102a, as shown in FIG. 1A.

In one embodiment, the third circuit board 102a is a flexible circuit board.

In one embodiment, the third circuit board 102a is a flexible printed circuit board.

In one embodiment, each of the first circuit board 102 and the second circuit board 104 is a flexible circuit board.

In one embodiment, each of the first circuit board 102 and the second circuit board 104 is a printed circuit board (PCB).

In one embodiment, the first circuit board 102, the second circuit board 104, and the third circuit board 102a are integrally formed as a contiguous circuit board that comprises a rigid substrate 104R1 and a flexible substrate 104F1.

In one embodiment, the electronic module 100 further comprises a fourth circuit board 103 disposed over a second lateral surface 101L2 of the body 101b, wherein at least one second electronic device 103b is disposed on the fourth circuit board 103, wherein the fourth circuit board 103 and the second circuit board 104 are electrically connected.

In one embodiment, the fourth circuit board 103 and the second circuit board 104 are electrically connected via the fifth circuit board 103a which is a second flexible circuit board.

In one embodiment, the first circuit board 102, the second circuit board 104, the fourth circuit board 103, the third circuit board 102a being a first flexible circuit board, and the fifth circuit board 103a being a second flexible circuit board are integrally formed as a contiguous circuit board that comprises at least one rigid substrate 104R1, 104R2 and at least one flexible substrate 104F1, 104F2.

In one embodiment, each of the first circuit board 102, the second circuit board 104, and the fourth circuit board 103 is a multilayer circuit board.

In one embodiment, each of the first circuit board 102, the second circuit board 104, and the fourth circuit board 103 is a flexible circuit board.

In one embodiment, as shown in FIG. 1B, the electronic module 100 further comprises a sixth circuit board 105 and a third adhesive layer 105a, wherein the third adhesive layer 105a is disposed on a third lateral surface of the body 101b, and the sixth circuit board 105 is disposed on the third adhesive layer 105a, wherein a plurality of conductive elements 105c are disposed on the sixth circuit board 105.

In one embodiment, as shown in FIG. 1B, the electronic module 100 further comprises a seventh circuit board 106 and a fourth adhesive layer 106a, wherein the fourth adhesive layer 106a is disposed on a fourth lateral surface of the body 101b, and the seventh circuit board 106 is disposed on the fourth adhesive layer 106c, wherein a plurality of conductive elements 106c are is disposed on the seventh circuit board 106.

In one embodiment, as shown in FIG. 1C, a plurality of conductive elements 104p are disposed on a bottom surface 104BS of the second circuit board 104.

In one embodiment, as shown in FIG. 1C, the conductive elements 104p comprise a plurality of electrodes of the electronic module 100, wherein the plurality of electrodes are disposed on the bottom surface 104BS of the second circuit board 104.

In one embodiment, as shown in FIG. 1C, the conductive elements 104p comprise a plurality of surface-mounted pads used as electrodes of the electronic module 100.

In one embodiment, the inductor 101 is a choke.

In one embodiment, the body 101b of the inductor 101 is a magnetic body, wherein the conductive wire 101a is disposed in the magnetic body, wherein the conductive wire 101a is electrically connected to the second circuit board.

In one embodiment, the conductive wire 101a forms a coil that is disposed in the body 101b.

In one embodiment, the conductive wire 101a forms a coil comprising a plurality of winding turns that are disposed in the body 101b.

In one embodiment, as shown in FIG. 1A, a first electrode 101c of the inductor 101 is electrically connected to the second circuit board 104.

In one embodiment, as shown in FIG. 1A, a second electrode 101d of the inductor 101 is electrically connected to the second circuit board 104.

In one embodiment, as shown in FIG. 1A, a first terminal part of the conductive wire 101a is extended across a bottom surface 101BS of the body 101b for forming the first electrode 101c of the inductor 101, wherein the first terminal part of the conductive wire 101a is electrically connected to a first pad 104b on a top surface of the second circuit board 104.

In one embodiment, as shown in FIG. 1A, a second terminal part of the conductive wire 101a is extended across the bottom surface 101BS of the magnetic body 101b for forming the second electrode 101d of the inductor 101, wherein the second terminal part of the conductive wire 101a is electrically connected to the second circuit board 104.

In one embodiment, as shown in FIG. 1A, a first terminal part of the conductive wire 101a is extended across a bottom surface 101BS of the body 101b for forming the first electrode 101c of the inductor 101, wherein the first terminal part of the conductive wire 101a is electrically connected to a first pad 104b on a top surface of the second circuit board 104.

In one embodiment, as shown in FIG. 1A, a second terminal part of the conductive wire 101a is extended across the bottom surface 101BS of the body 101b for forming the second electrode 101d of the inductor 101, wherein the second terminal part of the conductive wire 101a is electrically connected to a second pad 104d on the top surface of the second circuit board 104.

Figure 1D:
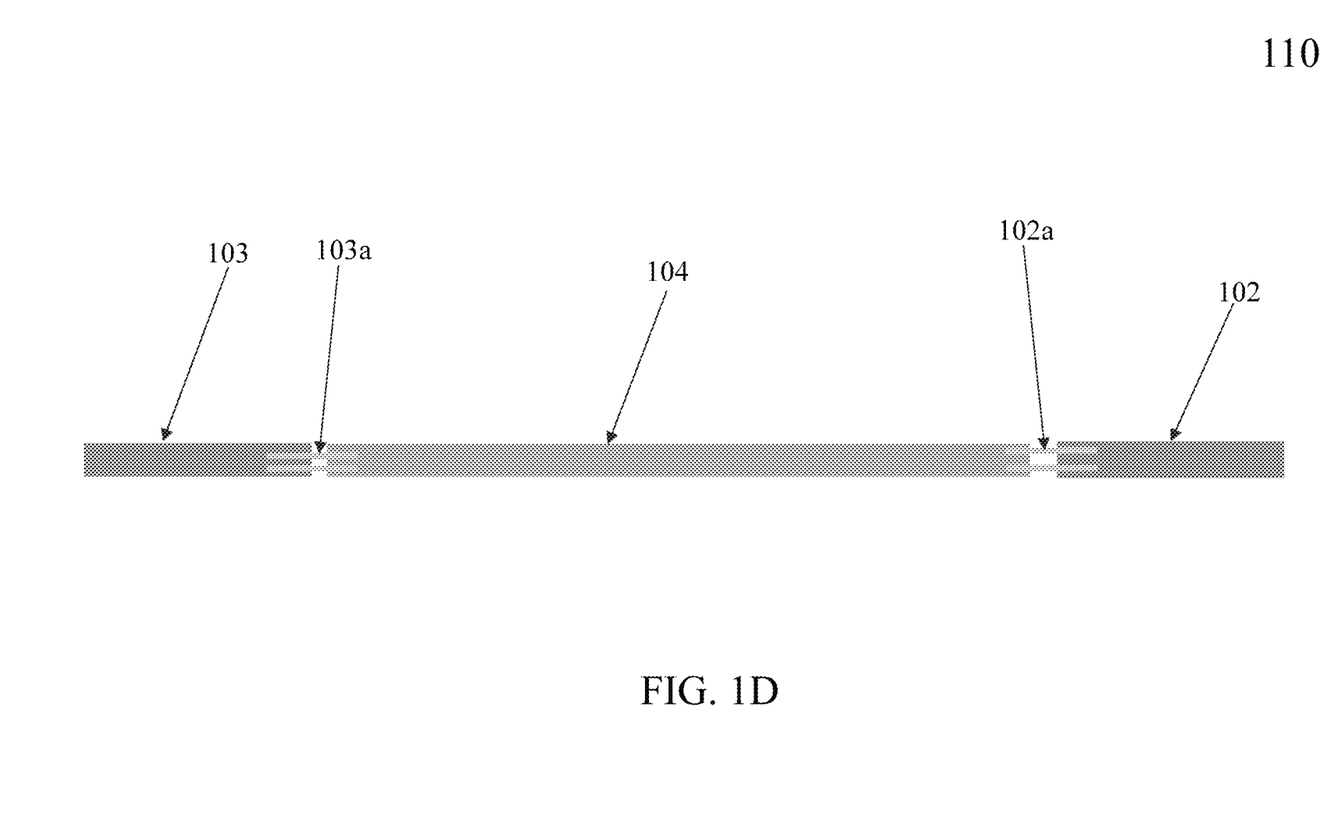
FIG. 1D is a cross-sectional side view of a contiguous circuit board according to one embodiment of the invention.

In one embodiment, an electronic module 100 is disclosed according to one embodiment of the present invention, wherein the electronic module comprises: an inductor 101 comprising a body 101b, wherein the body 101b comprises a first lateral surface 101L1 and a bottom surface 101BS; a contiguous circuit board 110, wherein the contiguous circuit board 110 comprises a first circuit board 102, a second circuit board 104, and a third circuit board 102a, as shown in FIG. 1D, wherein the first circuit board 102 of the contiguous circuit board 110 is disposed over the first lateral surface 101L1 of the body 101b with at least one first electronic device 102b, such as an IC, being disposed on the first circuit board 102 of the contiguous circuit board 110, and the second circuit board 104 of the contiguous circuit board 110 is disposed under the body 101b of the inductor 101 and electrically connected to the inductor 101, wherein the third circuit board 102a is a flexible circuit board that is electrically connecting the first circuit board 102 and the second circuit board 104 of the contiguous circuit board 110.

In one embodiment, the contiguous circuit board 110 further comprises a fourth circuit board 103 and a fifth circuit board 103a, wherein the fourth circuit board 103 is disposed over a second lateral surface 101L2 of the body 101b, wherein at least one second electronic device 103b, such as an IC, is disposed on the fourth circuit board 103, wherein the fifth circuit board 103a is a flexible circuit board that is electrically connecting the fourth circuit board 103 and the second circuit board 104 of the contiguous circuit board 110.

Figure 1E:
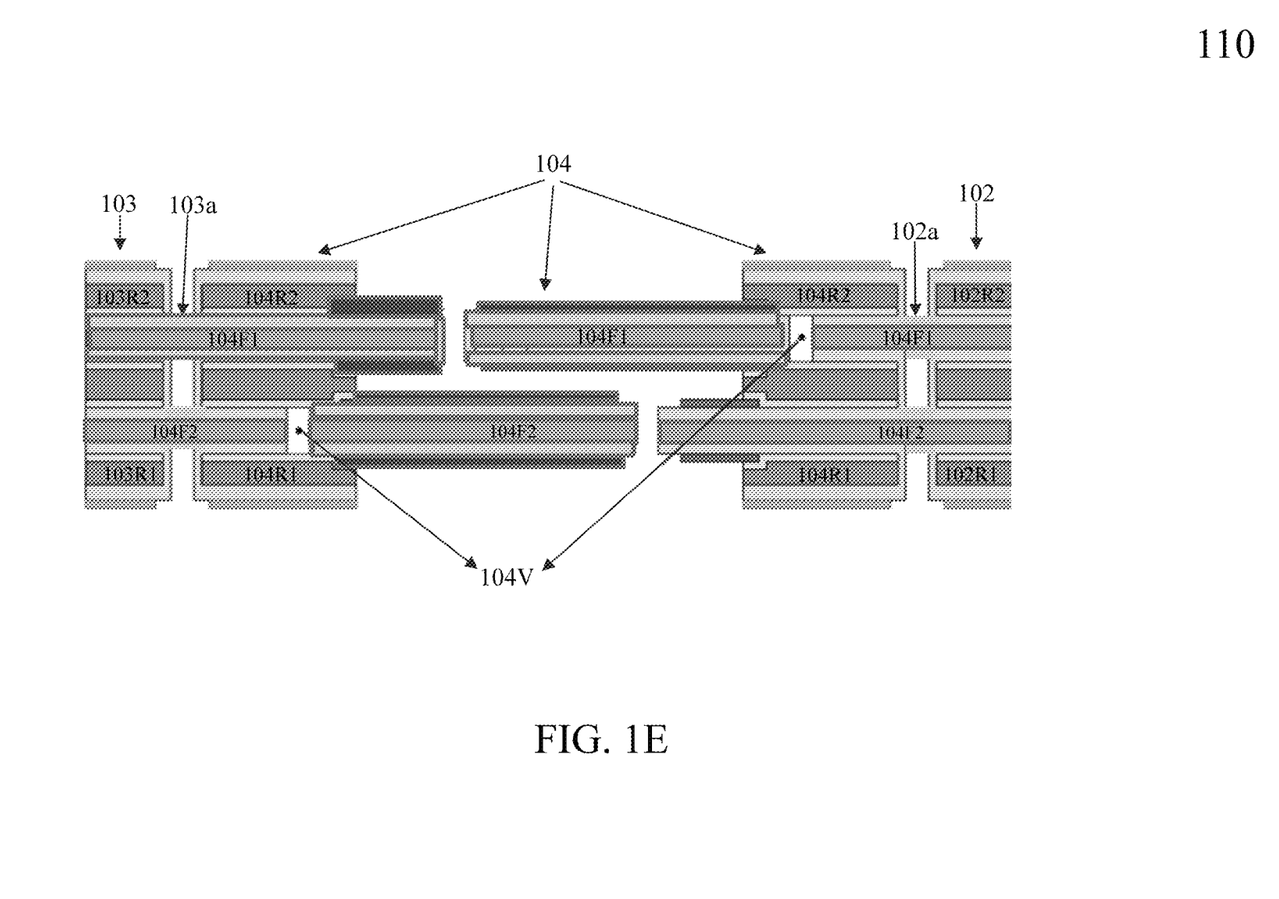
FIG. 1E is a cross-sectional side view of a structure of the contiguous circuit board according to one embodiment of the invention.

In one embodiment, as shown in FIG. 1E, the second circuit board 104 comprises at least one rigid substrate 104R1, 104R2, and at least one flexible substrate 104F1, 104F2.

In one embodiment, as shown in FIG. 1E, the at least one flexible substrate 104F1, 104F2 is extended from the second circuit board 104 to the first circuit board 102 via the third circuit board 102a.

In one embodiment, as shown in FIG. 1E, the first circuit board 102 comprises at least one rigid substrate 102R1, 102R2.

In one embodiment, as shown in FIG. 1E, the fourth circuit board 103 comprises at least one rigid substrate 103R1, 103R2.

In one embodiment, as shown in FIG. 1E, at least one flexible substrate 104F1, 104F2 is extended from the second circuit board 104 to the fourth circuit board 103 via the fifth circuit board 103a.

In one embodiment, as shown in FIG. 1E, the first circuit board 102, the second circuit board 104, and the third circuit board 102a are integrally formed.

In one embodiment, as shown in FIG. 1E, the first circuit board 102, the second circuit board 104, the third circuit board 102a, the fourth circuit board 103, and the fifth circuit board 103a of the contiguous circuit board 110 are integrally formed.

In one embodiment, as shown in FIG. 1E, the second circuit board 104 comprises at least one rigid substrate 104R1, 104R2 and at least one flexible substrate 104F1, 104F2 which is extended to the third circuit board 102a and the first circuit board 102, wherein the third circuit board 102a comprises a corresponding portion of the at least one flexible substrate 104F1, 104F2 which can be bent onto the first lateral surface 101L1 of the body 101b of the inductor 101.

In one embodiment, as shown in FIG. 1E, the at least one flexible substrate 104F1, 104F2 is extended to the fifth circuit board 103a and the fourth circuit board 103, wherein the fifth circuit board 103a comprises a corresponding portion of the at least one flexible substrate 104F1, 104F2 which can be bent onto the second lateral surface 101L2 of the body 101b of the inductor 101.

In one embodiment, as shown in FIG. 1E, the first circuit board 102 and the second circuit board 104 are integrally formed as a contiguous circuit board 110.

In one embodiment, as shown in FIG. 1E, a flexible substrate 104F1 is extended across the second circuit board 104, the third circuit board 102a, and the first circuit board 102.

In one embodiment, as shown in FIG. 1E, the flexible substrate 104F1 is extended across the second circuit board 104, the fifth circuit board 103a, and the fourth circuit board 103.

In one embodiment, as shown in FIG. 1E, at least one via 104V is formed in the at least one flexible substrate 104F1, 104F2.

In one embodiment, each of the first circuit board 102, the second circuit board 104, and the fourth circuit board 103 of the contiguous circuit board 110 comprises a rigid substrate and a flexible substrate.

In one embodiment, each of the first circuit board 102, the second circuit board 104, and the fourth circuit board 103 of the contiguous circuit board 110 is a flexible circuit board.

In one embodiment, each of the first circuit board 102, the second circuit board 104, and the fourth circuit board 103 of the contiguous circuit board 110 comprises a PCB.

In one embodiment, the second circuit board 104 of the contiguous circuit board 110 comprises a rigid substrate 104R1 and a flexible substrate 104F1, wherein the rigid substrate 104R1 and the flexible substrate 104F1 are stacked in a vertical direction.

In one embodiment, each of the first circuit board 102, the second circuit board 104, and the fourth circuit board 103 of the contiguous circuit board 110 comprises a plurality of rigid substrates and a plurality of flexible substrates.

In one embodiment, the contiguous circuit board 110 comprises at least one of the following: a PCB, BT (Bismaleimide Triazine) substrate, metallic substrate or ceramic substrate.

In one embodiment, the contiguous circuit board 110 is a multilayer circuit board.

Figure 1F:
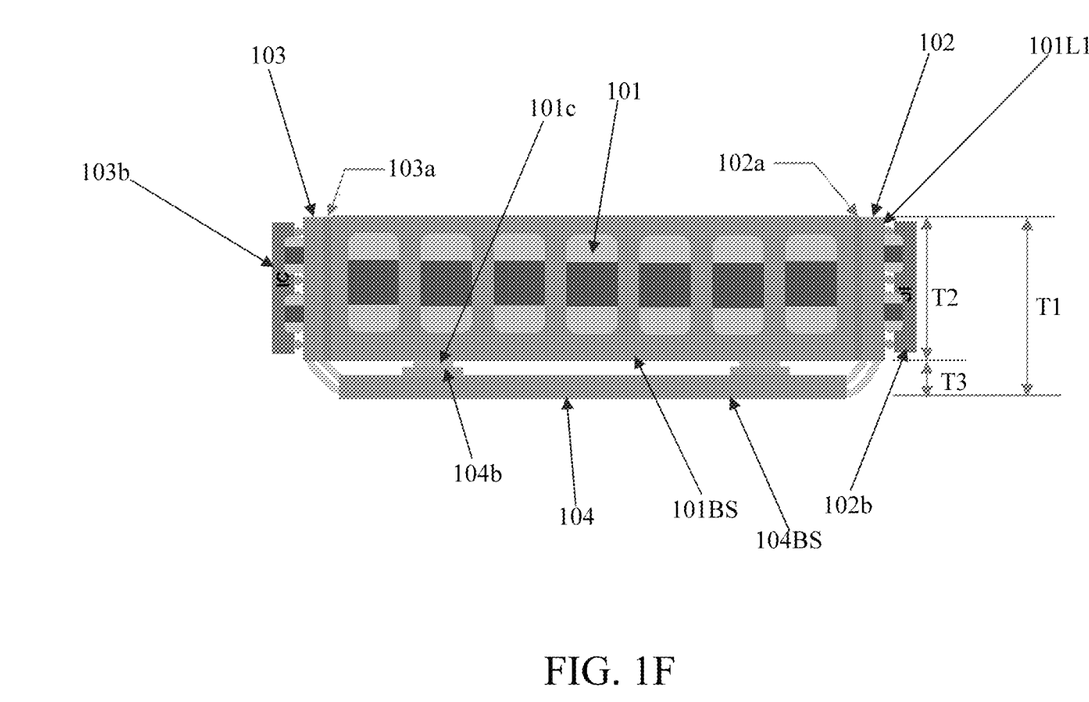
FIG. 1F is a cross-sectional side view of an electronic module according to one embodiment of the invention.

In one embodiment, as shown in FIG. 1F, the total thickness T1 of the electronic module 100 is 2500-2600 um, the total thickness T2 of the first lateral surface 101L1 is 1450-1550 um, and the total thickness T3 from the bottom surface of the body 101b to the bottom surface 104BS of the second circuit board 104 is 1000-1100 um.

In one embodiment, as shown in FIG. 1F, the total thickness T1 of the electronic module 100 is 2550 um, the total thickness T2 of the first lateral surface 101L1 is 1500 um, and the total thickness T3 from the bottom surface of the body 101b to the bottom surface 104BS of the second circuit board 104 is 1050 um.

In one embodiment, a method to form the electronic module 100 is disclosed as shown in FIG. 1D and FIG. 2A-2F according to one embodiment of the present invention. As shown in FIG. 1D, a contiguous circuit board 110 is provided, wherein the contiguous circuit board 110 comprises a first circuit board 102, a second circuit board 104, and a third circuit board 102a.

In one embodiment, the contiguous circuit board 110 further comprises a fourth circuit board 103 and a fifth circuit board 103a.

Figure 2A:
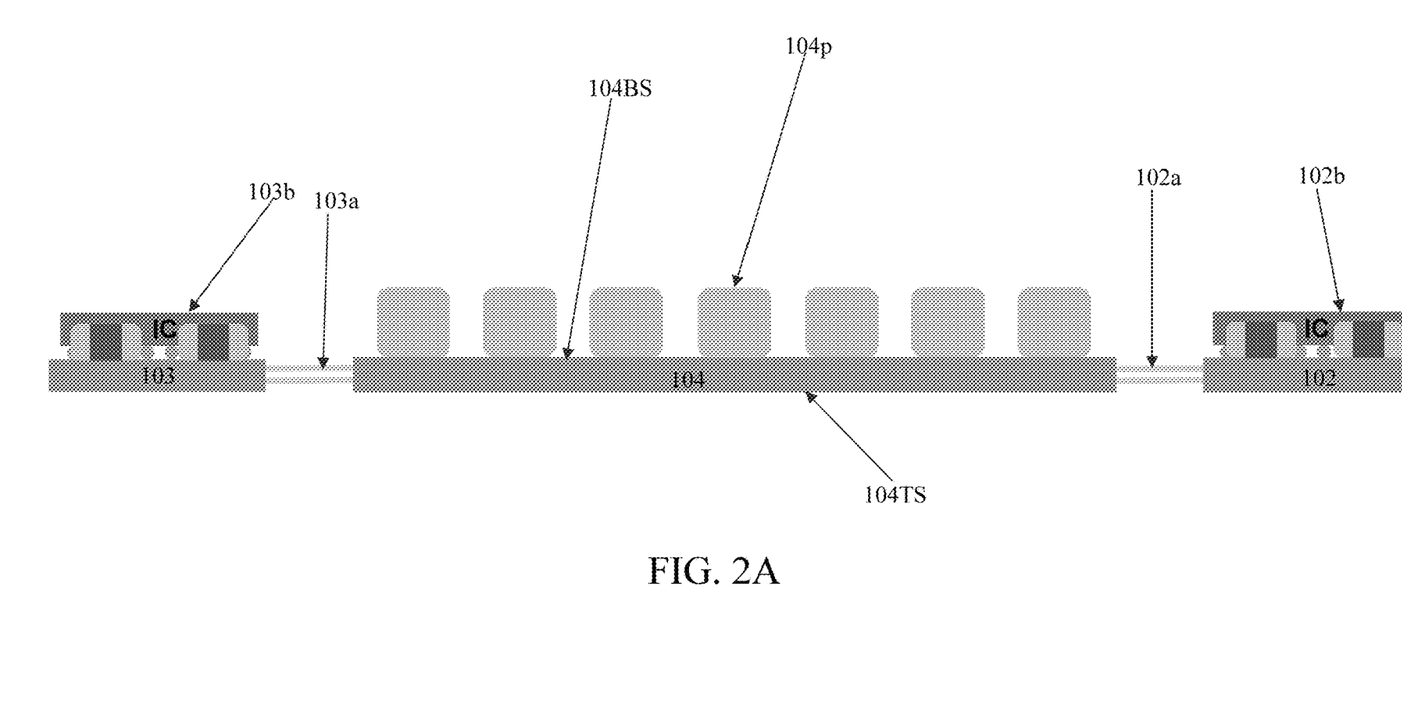
FIG. 2A is a cross-sectional side view of a structure after a plurality of conductive elements are disposed on a bottom surface of the contiguous circuit board according to one embodiment of the invention.

As shown in FIG. 2A, at least one first electronic device 102b is disposed on the first circuit board 102, and a plurality of conductive elements 104p are disposed on the bottom surface 104BS of the second circuit board 104.

In one embodiment, the conductive elements 104p comprise a plurality of electrodes of the electronic module 100, wherein the plurality of electrodes are disposed on the bottom surface 104BS of the second circuit board 104.

In one embodiment, the conductive elements 104p comprise a plurality of surface-mounted pads used as electrodes of the electronic module 100.

In one embodiment, as shown in FIG. 2A, at least one second electronic device 103b is disposed on the fourth circuit board 103.

Figure 2B:
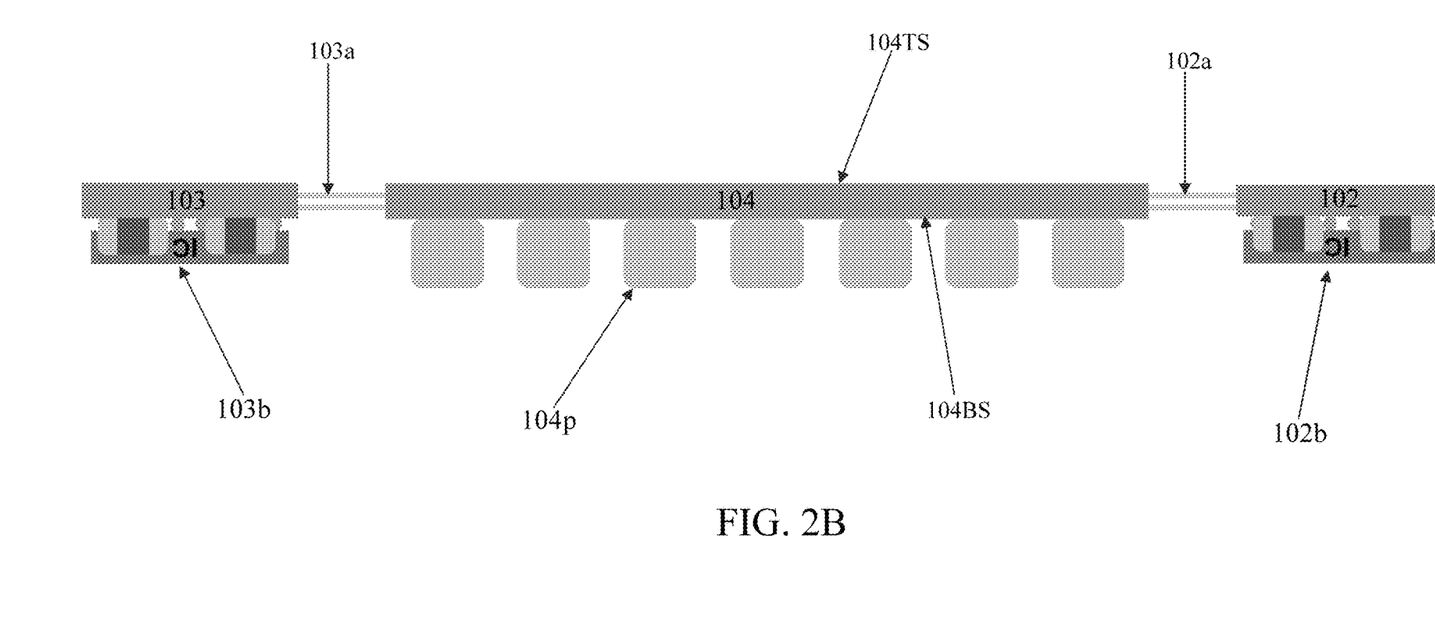
FIG. 2B is a cross-sectional side view of a structure after the contiguous circuit board is flipped according to one embodiment of the invention.

As shown in FIG. 2B, the contiguous circuit board 110 is flipped such that the bottom surface 104BS of the second circuit board 104 is lower than the top surface 104TS of the second circuit board 104.

Figure 2C:
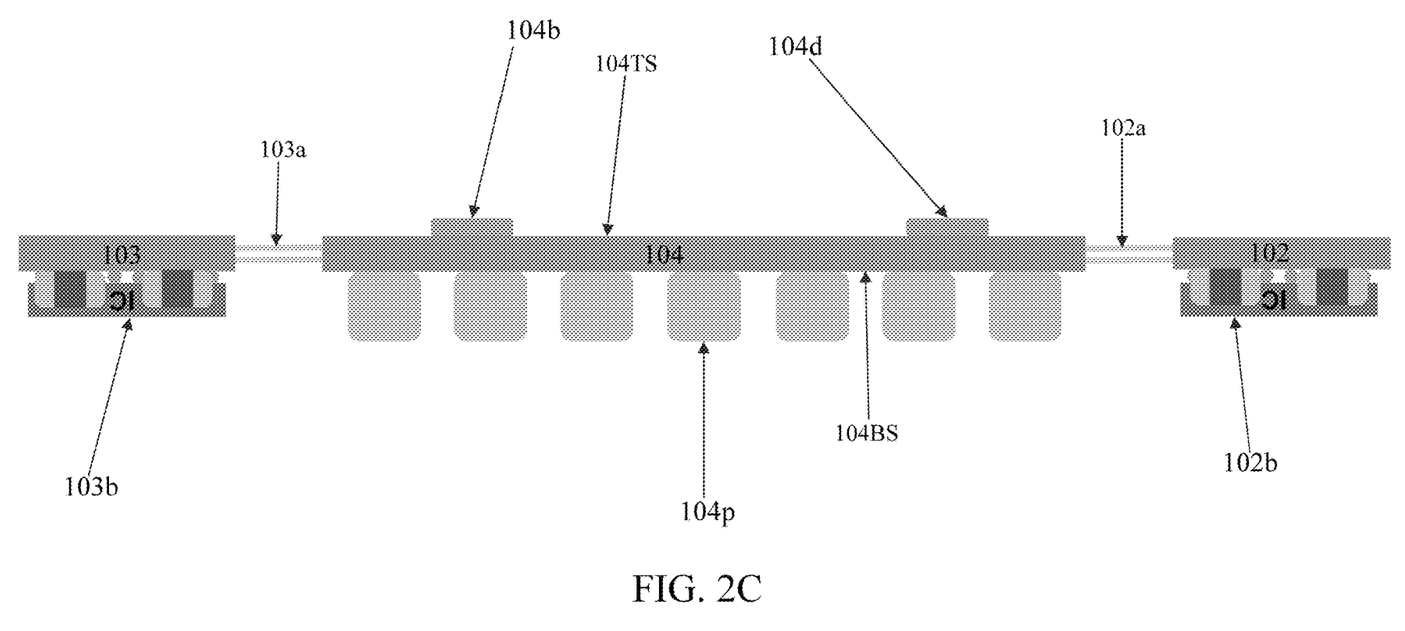
FIG. 2C is a cross-sectional side view of a structure after a plurality of pads are disposed on a top surface of the contiguous circuit board according to one embodiment of the invention.

As shown in FIG. 2C, a plurality of pads 104b, 104d are disposed on the top surface 104TS of the second circuit board 104.

Figure 2D:
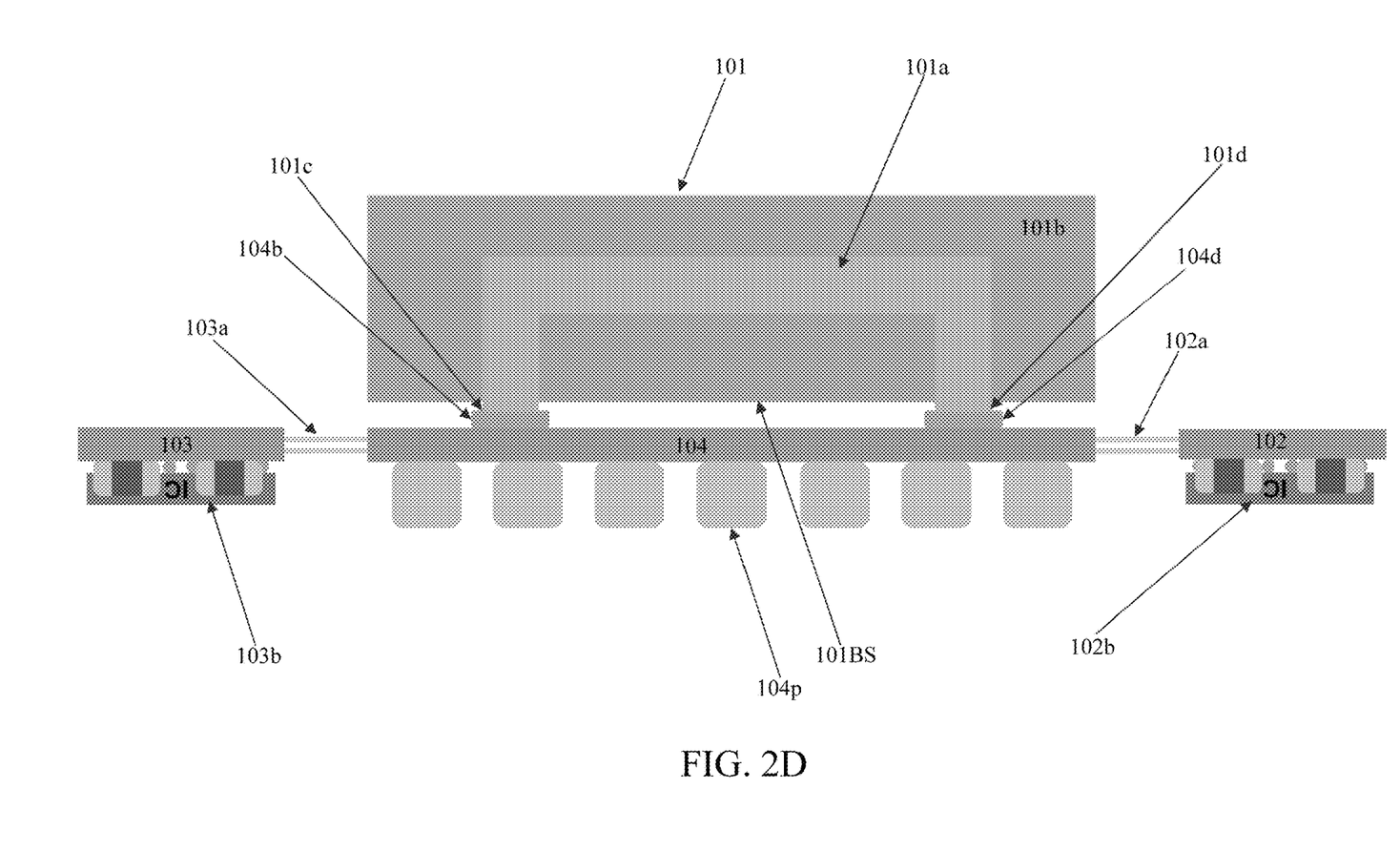
FIG. 2D is a cross-sectional side view of a structure after an inductor is disposed on the contiguous circuit board according to one embodiment of the invention.

As shown in FIG. 2D, an inductor 101 comprising a body 101b is disposed on the top surface 104TS of the contiguous circuit board 110.

In one embodiment, as shown in FIG. 2D, a first terminal part of the conductive wire 101a is extended across a bottom surface 101BS of the body 101b, wherein the first terminal part of the conductive wire 101a is electrically connected to a first pad 104b on a top surface of the second circuit board 104.

In one embodiment, as shown in FIG. 2D, a second terminal part of the conductive wire 101a is extended across the bottom surface 101BS of the body 101b, wherein the second terminal part of the conductive wire 101a is electrically connected to a second pad 104d on the top surface of the second circuit board 104.

Figure 2E:
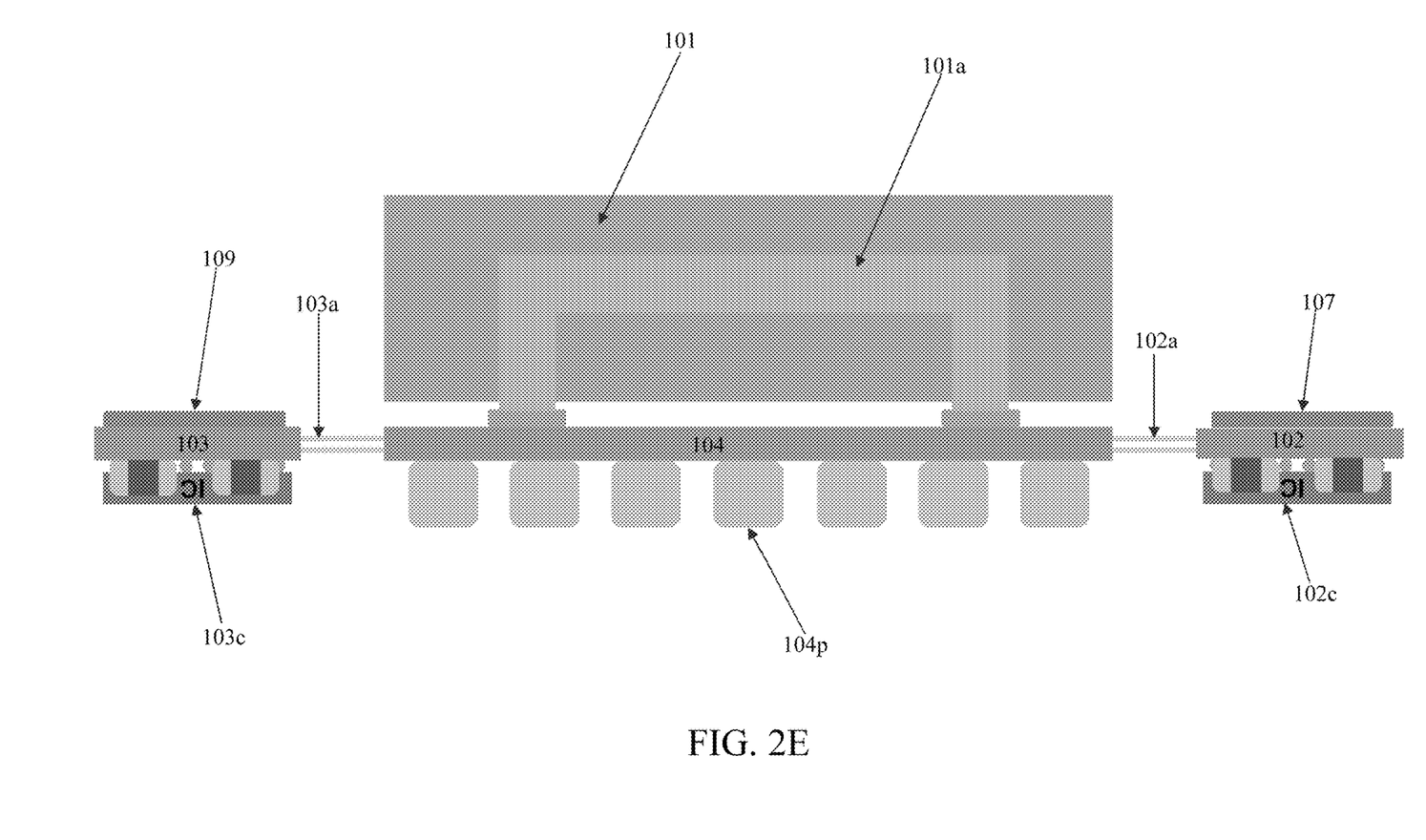
FIG. 2E is a cross-sectional side view of a structure after adhesive layers are disposed on the contiguous circuit board according to one embodiment of the invention.

In one embodiment, as shown in FIG. 2E, a first adhesive layer 107 is disposed on the first circuit board 102.

In one embodiment, as shown in FIG. 2E, a second adhesive layer 109 is disposed on the fourth circuit board 103.

Figure 2F:
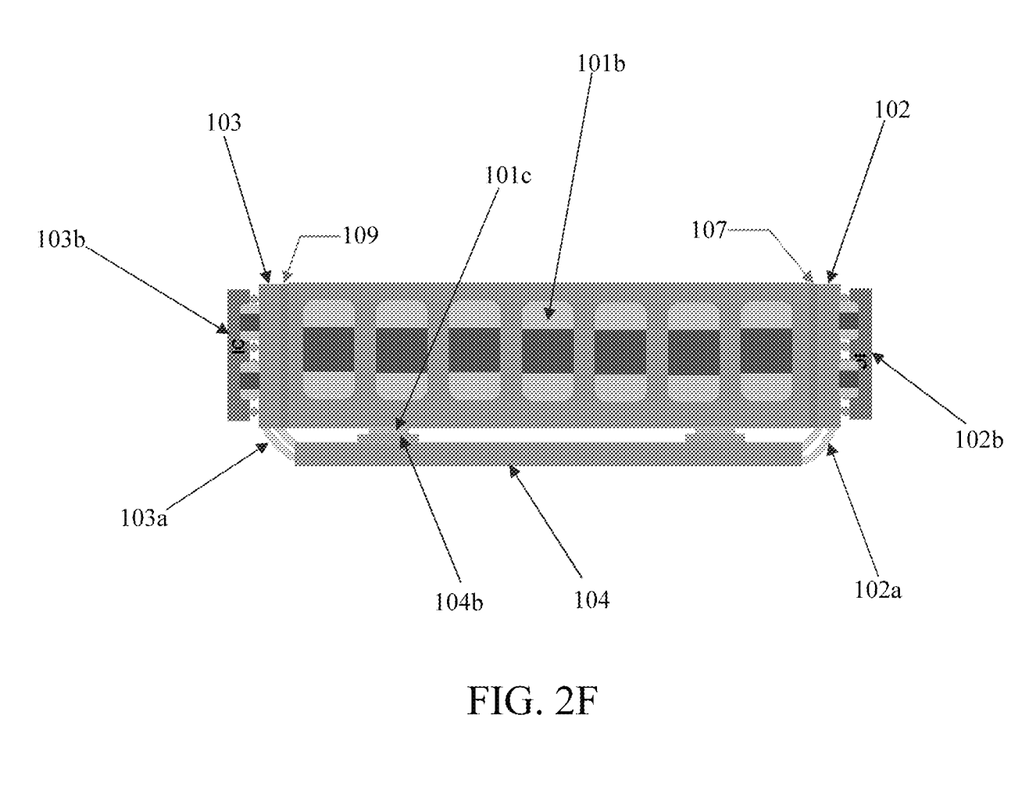
FIG. 2F is a cross-sectional side view of a structure after the contiguous circuit board is bent such that corresponding portions of the contiguous circuit board are attached to the lateral surfaces of the body of the inductor according to one embodiment of the invention.

In one embodiment, as shown in FIG. 2F, the first circuit board 102 of the contiguous circuit board 110 is attached to the first lateral surface 101L1 of the body 101b via the first adhesive layer 107, and the second circuit board 104 of the contiguous circuit board 110 is disposed under the body 101b of the inductor 101 and electrically connected to the inductor 101, wherein the third circuit board 102a is a flexible circuit board that is electrically connecting the first circuit board 102 and the second circuit board 104 of the contiguous circuit board 110.

In one embodiment, as shown in FIG. 2F, the fourth circuit board 103 of the contiguous circuit board 110 is attached to the second lateral surface 101L2 of the body 101b via the second adhesive layer 109, wherein the fifth circuit board 103a is a flexible circuit board that is electrically connecting the fourth circuit board 103 and the second circuit board 104 of the contiguous circuit board 110.

The main advantages of the present invention are described as follows: (1) using a circuit board comprising rigid and flexible substrates to wrap the body of an inductor and placing the electronic devices, such as IC and passive components, on the side surfaces of the body of the inductor to form an electronic module can effectively reduce the thickness of the electronic module to be less than 3 mm; (2) electrodes formed at the bottom surface of the circuit board can be used to electrically connect the electronic module with a motherboard, which can provide flexibility of the design of the electronic module; (3) the present invention can utilize ICs in various forms such as CSP or QFN package, etc., without being limited to embedded ICs.

From the foregoing, it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. An electronic module, comprising:
    an inductor, comprising a body and a conductive wire, wherein at least one portion of the conductive wire is disposed in the body, wherein the body comprises a first lateral surface and a bottom surface;
    a first circuit board, disposed over the first lateral surface, wherein at least one first electronic device is disposed on the first circuit board and electrically connected to the first circuit board; and
    a second circuit board, wherein the second circuit board is disposed under the bottom surface of the body of the inductor and electrically connected to the inductor, wherein the first circuit board and the second circuit board are electrically connected by a third circuit board comprising a first flexible circuit board.

2. The electronic module of claim 1, wherein the first circuit board is attached to the first lateral surface via an adhesive layer disposed on the first lateral surface.

3. The electronic module of claim 1, wherein the at least one first electronic device comprises at least one IC.

4. The electronic module of claim 3, wherein the at least one electronic device comprises at least one passive component.

5. The electronic module of claim 1, wherein each of the first circuit board, the second circuit board and the first flexible circuit board comprises a corresponding portion of a flexible substrate.

6. The electronic module of claim 1, wherein the second circuit board comprises at least one rigid substrate and at least one flexible substrate.

7. The electronic module of claim 1, wherein the first circuit board, the second circuit board, and the first flexible circuit board are integrally formed as a contiguous circuit board that comprises at least one flexible substrate.

8. The electronic module of claim 1, wherein each of the first circuit board and the second circuit board is a flexible circuit board.

9. The electronic module of claim 1, wherein there is no electronic device disposed between the body and the second circuit board.

10. The electronic module of claim 1, further comprising a fourth circuit board disposed over a second lateral surface of the body, wherein at least one second electronic device is disposed on the fourth circuit board.

11. The electronic module of claim 10, wherein the fourth circuit board and the second circuit board are electrically connected via a second flexible circuit board.

12. The electronic module of claim 11, wherein the first circuit board, the second circuit board, the fourth circuit board, the first flexible circuit board, and the second flexible circuit board are integrally formed as a contiguous circuit board that comprises at least one rigid substrate and at least one flexible substrate.

13. The electronic module of claim 1, wherein a plurality of pads are disposed on a bottom surface of the second circuit board.

14. The electronic module of claim 1, wherein the inductor is a choke.

15. The electronic module of claim 1, wherein the body is a magnetic body, wherein a coil formed by the conductive wire is disposed in the magnetic body.

16. The electronic module of claim 1, wherein a first terminal part of the conductive wire is extended across the bottom surface of the body and electrically connected to a first pad on the second circuit board.

17. The electronic module of claim 16, wherein a second terminal part of the conductive wire is extended across the bottom surface of the body and electrically connected to a second pad on the second circuit board.

18. An electronic module, comprising:
    an inductor, comprising a body, wherein the body comprises a first lateral surface and a bottom surface;
    a contiguous circuit board, comprising a first circuit board, a second circuit board, and a third circuit board, wherein the first circuit board is disposed over the first lateral surface with at least one first electronic device being disposed on the first circuit board, and the second circuit board is disposed under the body of the inductor and electrically connected to the inductor, wherein the third circuit board is a first flexible circuit board that is electrically connecting the first circuit board and the second circuit board.

19. The electronic module of claim 18, wherein the contiguous circuit board further comprises a fourth circuit board and a fifth circuit board, wherein the fourth circuit board is disposed over a second lateral surface of the body with at least one second electronic device being disposed on the fourth circuit board, wherein the fifth circuit board is a second flexible circuit board that is electrically connecting the fourth circuit board and the second circuit board.

* * * * *